(12) United States Patent
Gaul et al.

(10) Patent No.: US 7,804,143 B2
(45) Date of Patent: Sep. 28, 2010

(54) RADIATION HARDENED DEVICE

(75) Inventors: Stephen Joseph Gaul, Melbourne Village, FL (US); Michael D. Church, Sebastian, FL (US); Brent R. Doyle, Malabar, FL (US)

(73) Assignee: Intersil Americas, Inc., Milpitas, CA (US)

( * ) Notice: Subject to any disclaimer, the term of this patent is extended or adjusted under 35 U.S.C. 154(b) by 0 days.

(21) Appl. No.: 12/372,893

(22) Filed: Feb. 18, 2009

(65) Prior Publication Data

US 2010/0038726 A1 Feb. 18, 2010

Related U.S. Application Data

(60) Provisional application No. 61/088,501, filed on Aug. 13, 2008, provisional application No. 61/097,262, filed on Sep. 16, 2008.

(51) Int. Cl.
*H01L 27/088* (2006.01)

(52) U.S. Cl. .................. 257/409; 257/394; 257/452; 257/484; 257/490; 257/494; 257/495; 257/605; 257/E29.242

(58) Field of Classification Search ................ 257/394, 257/409, 452, 484, 490, 494, 495, 605, E29.242
See application file for complete search history.

(56) References Cited

U.S. PATENT DOCUMENTS

| | | | |
|---|---|---|---|
| 4,849,366 A | 7/1989 | Hsu et al. | |
| 5,204,541 A * | 4/1993 | Smayling et al. | ............ 257/138 |
| 6,586,807 B2 | 7/2003 | Nishida et al. | |
| 6,762,128 B2 | 7/2004 | Bernkopf et al. | |
| 7,202,538 B1 | 4/2007 | Hopper et al. | |
| 2006/0097293 A1 | 5/2006 | Gaul et al. | |
| 2006/0223269 A1* | 10/2006 | Honma | ....................... 438/294 |

* cited by examiner

*Primary Examiner*—Tan N Tran
(74) *Attorney, Agent, or Firm*—Barnes & Thornburg LLP

(57) ABSTRACT

A "tabbed" MOS device provides radiation hardness while supporting reduced gate width requirements. The "tabbed" MOS device also utilizes a body tie ring, which reduces field threshold leakage. In one implementation the "tabbed" MOS device is designed such that a width of the tab is based on at least a channel length of the MOS device such that a radiation-induced parasitic conduction path between the source and drain region of the device has a resistance that is higher than the device channel resistance.

12 Claims, 10 Drawing Sheets

RADIATION HARDENED DEVICE

This application claim priority to U.S. Provisional Pat. App. 61/088,501 filed Aug. 13, 2008, and U.S. Provisional Pat. App. 61/097,262, filed Sep. 16, 2008, the disclosures of which are incorporated herein by reference in their entirety.

The present disclosure relates generally to radiation hardened MOS devices.

DETAILED DESCRIPTION OF EMBODIMENTS

Figure 1:
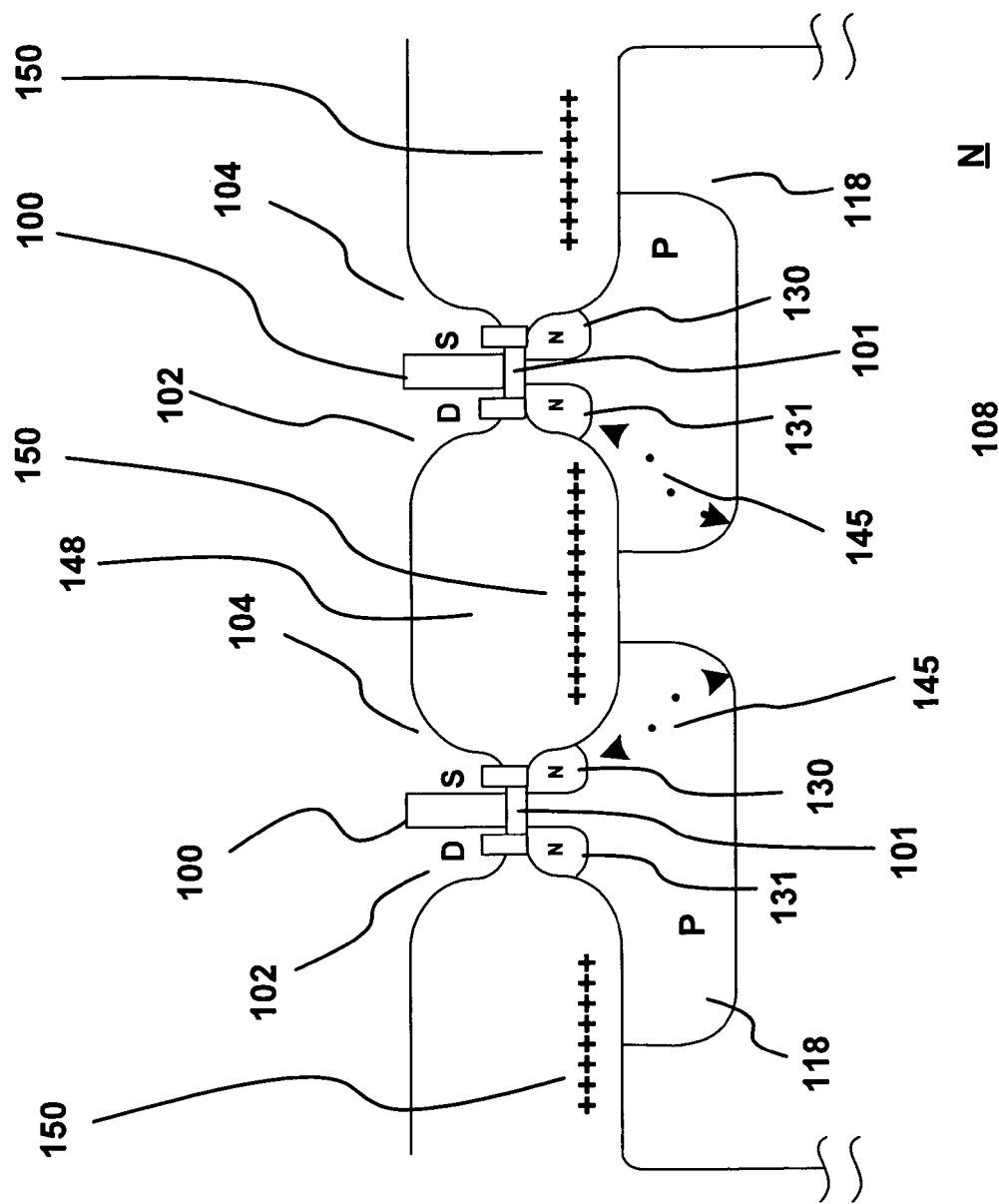
FIG. 1 is a cross section view of two MOS devices for the purposes of describing leakage suffered by a conventional device.

Integrated Circuits ("ICs") consist of hundreds of thousands or even millions of transistors and other devices. The spacing between adjacent transistors in such circuits is quite small and electrical leakage between devices does occur. FIG. 1 describes the device-to-device leakage suffered by conventional MOS devices. Two neighboring MOS devices each include gate 100 with thin gate oxide 101, drain 131 with contact 102 and source 130 with contact 104. The conventional design suffers from device-to-device leakage along path 145 between, for example, the source 130 and the substrate 108 through the body 118. Ionizing radiation causes oxide charge 150 in the local thick oxide 148, which results in some degree of inversion of the P well 118 along the path 145. As a result, the parasitic conduction path 145 occurs between devices and to substrate 108.

Isolation structures are therefore required to block such leakage currents. Therefore, as part of the quest to provide radiation hardened MOS devices in ICs, various conventional options for blocking leakage currents are available. For example, additional "guard band" implants under the field oxide may be used to increase the threshold voltage of parasitic transistor and minimize leakage as described in FIG. 12 of U.S. Pat. No. 6,762,128 and in FIG. 2 of U.S. Pat. No. 4,849,366.

Figure 2:
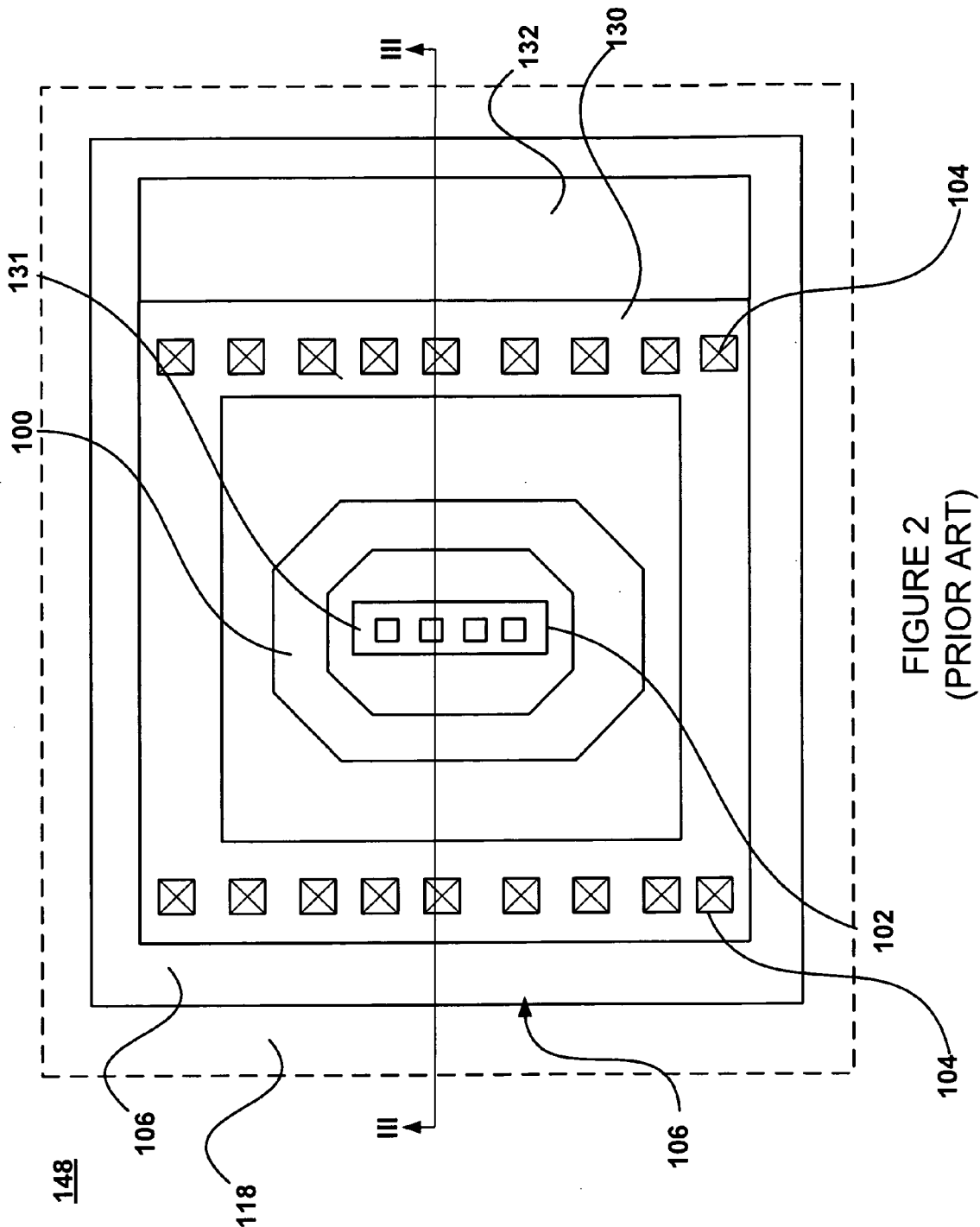
FIG. 2 provides a plan view of a conventional circular gate NMOS device.
Figure 3:
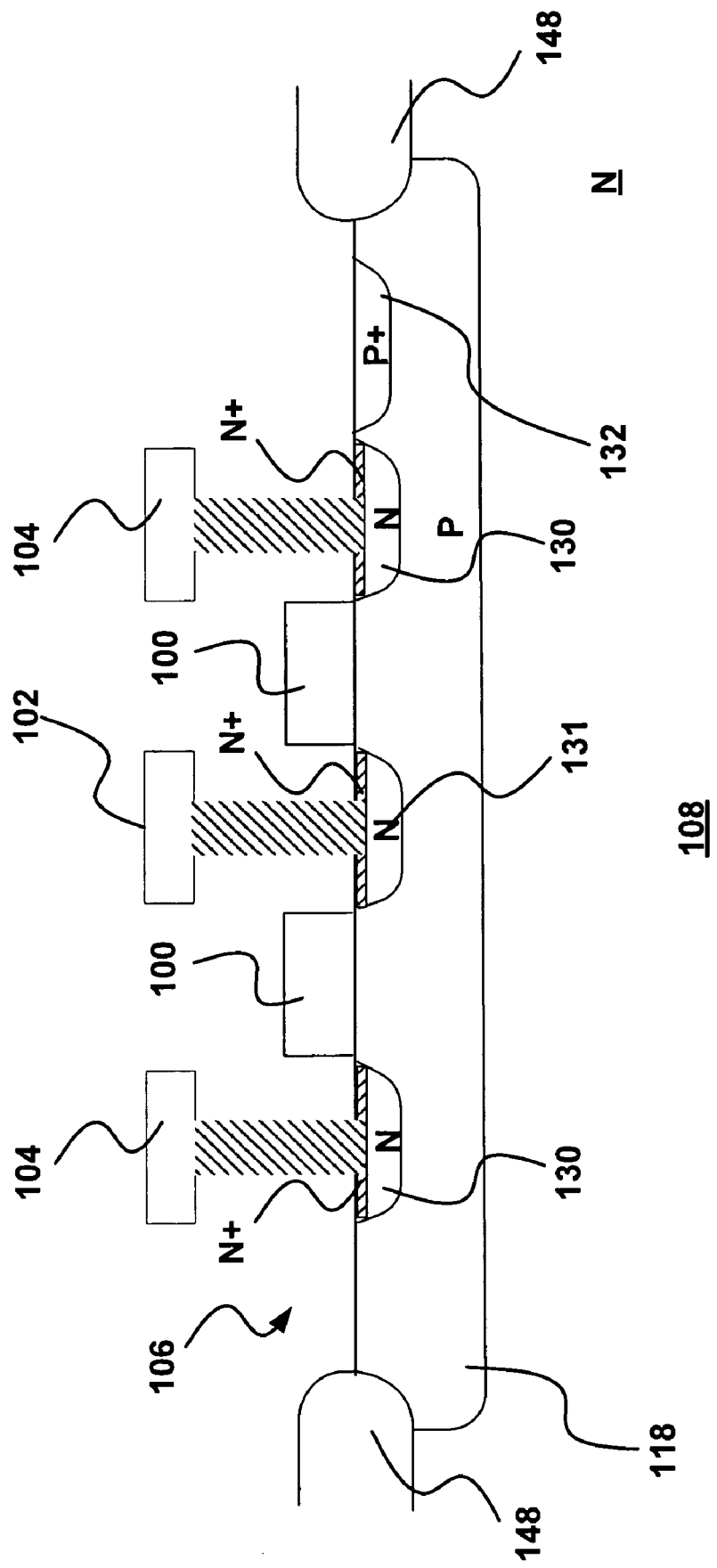
FIG. 3 shows a cross section taken along lines III-III of FIG. 2.

As a second alternative, conventional circular devices such as that illustrated in FIGS. 2 and 3 may be implemented (another example being shown in FIG. 3 of U.S. Pat. No. 4,849,366). FIG. 2 illustrates a top view of a prior art device including a circular gate 100 in spaced relationship with the drain 131 and source 130. LOCalized Oxidation of Silicon processes (LOCOS) 148 may be used to define the exposed active device regions 106 of the body 118 in the substrate 108 and to provide dielectric isolation. A body contact region 132 is also provided. However, LOCOS may not be a preferred isolation method for high-device-density ICs because of its characteristic "bird's beak" spur, as explained in U.S. patent application Ser. No. 11/267,175 filed Nov. 7, 2005, the disclosure of which is incorporated by reference in its entirety. As a result of this characteristic, LOCOS processes use a relatively large amount of chip "real estate." Therefore, a conventionally known alternative technique called Shallow Trench Isolation ("STI") may be used to provide dielectric isolation while using less chip real estate as described in U.S. Pat. No. 6,762,128.

Nevertheless, a problem with conventional circular devices such as that shown in FIG. 2 is that they are area intensive and have a minimum device width much larger than what may be available or necessary for associated technology or applications. Further, such devices also suffer from a large gate overlap capacitance, which can be problematic and may require careful modeling. Thus, alternative NMOS designs to those conventionally available are valuable.

Figure 4:
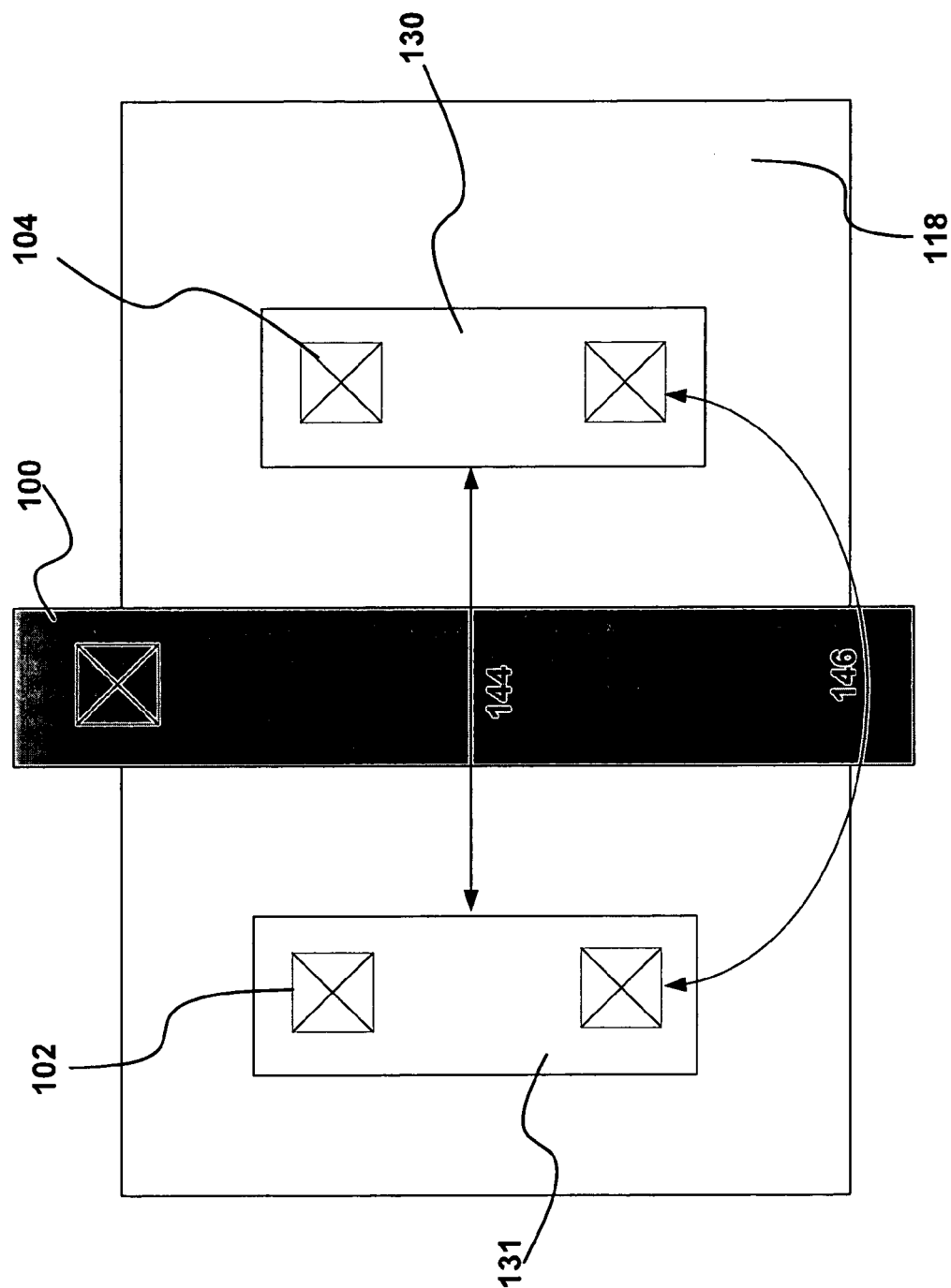
FIG. 4 is an explanatory diagram provided for the purposes of describing leakage suffered by a conventional device.

FIG. 4 illustrates how a conventional MOS device is subject to drain-to-source radiation-induced parasitic edge conduction and will be referred to in order to explain the parasitic conduction paths for such conventional device designs. As illustrated in FIG. 4, in conventional MOS device, a path 144 for current between the source 130 and the drain 131 is controlled by the device threshold and is not substantially affected by total radiation dose mainly due to the presence of thin gate oxide 101. However, the portion of a drain-to-source parasitic conduction along path 146 located under a local thick oxide 148 is substantially affected by the total radiation dose. Thus, the parasitic edge conduction path 146 becomes the primary path between the source 130 and drain 131 and is not substantially affected by gate bias during normal operation.

Therefore, in accordance with an embodiment of this disclosure, a "tabbed" NMOS device may be used to provide radiation hardened features typically provided by conventional circular devices while supporting reduced gate width requirements. Such a tabbed structure is disclosed in detail in U.S. patent applicatin Ser. No. 11/267,175 and was originally developed as a solution to an ElectroStatic Discharge (ESD) problem. The tabbed structure provides a 100% improvement in ESD performance over non-tabbed ESD supply clamps; however, as recognized in this disclosure, the tabbed design may also be used to provide radiation hardened features conventionally provided by circular devices while supporting minimum gate width capability.

Further, in accordance with disclosed embodiments herein, such a "tabbed" NMOS device may also utilize a P-type guardring that can optionally serve as a contact with the device body and, which may be provided to reduce field threshold leakage, as disclosed in U.S. Provisional Pat. App. 61/088,501. When the tabbed design is provided in conjunction with an additional P-type guardring, the field threshold leakage is also reduced. Thus, combining the P-type guardring and the tabbed design presents a new and valuable radiation hardened NMOS design.

Figure 5:
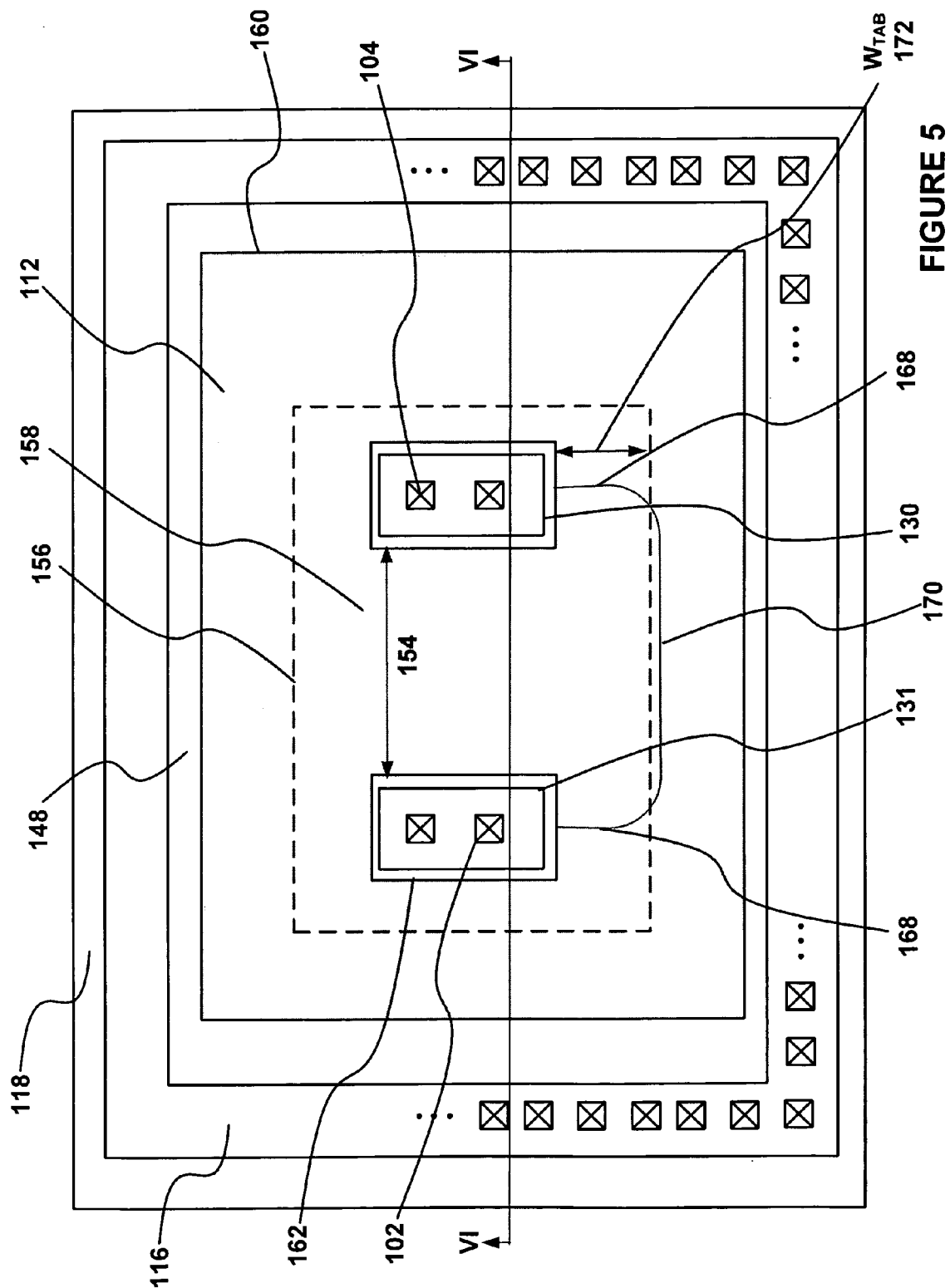
FIG. 5 provides a plan view of a device provided according to the present disclosure.
Figure 6:
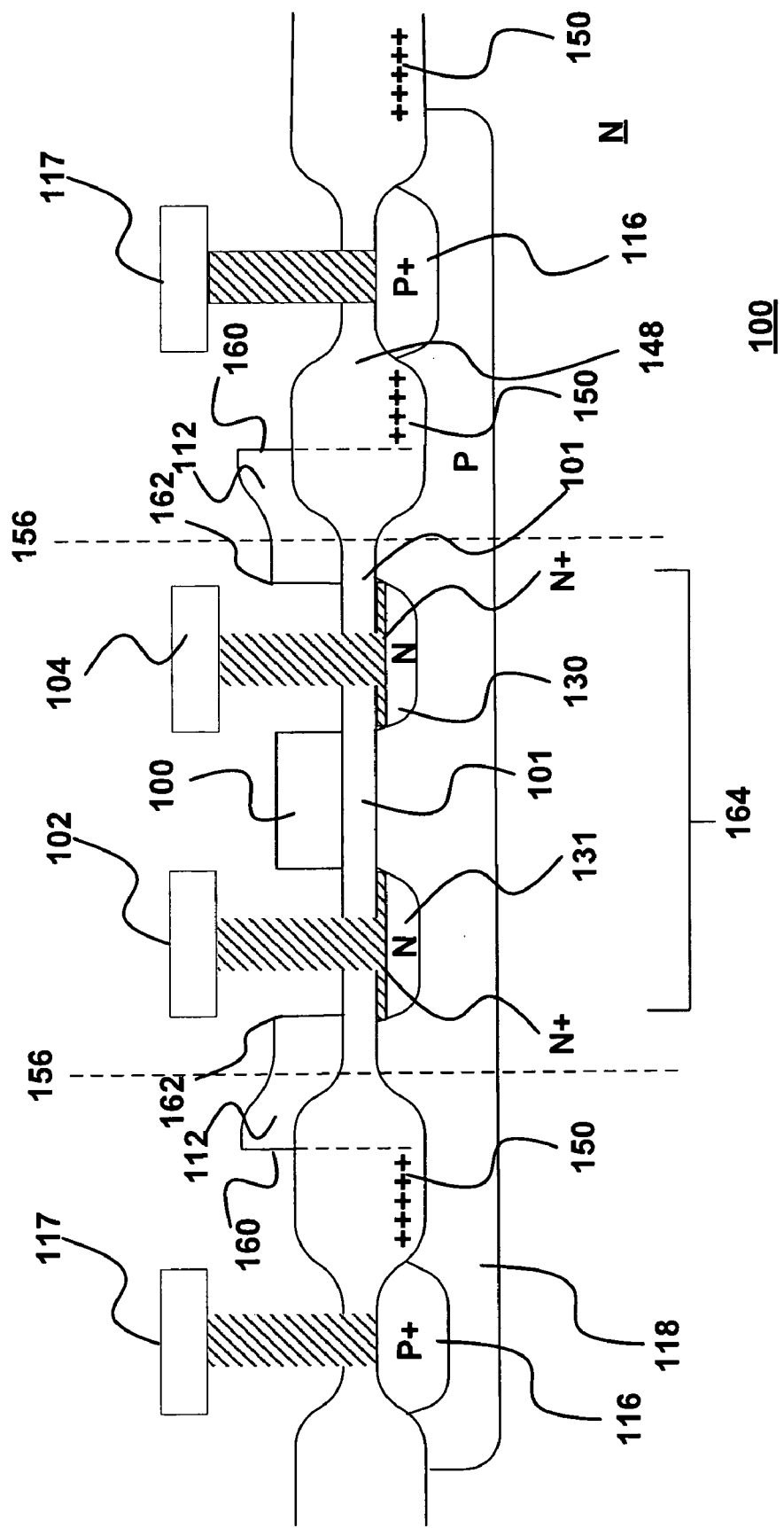
FIG. 6 shows a cross section of a device provided according to the embodiment illustrated in FIG. 5 along line IV-IV.

FIGS. 5 and 6 provide a plan and cross section views respectively of a device provided according to the present disclosure. Those elements of FIGS. 5-10 that have the same function as those in FIGS. 1-4 have the same reference number. As illustrated in FIG. 5, when a full polycrystalline silicon tab or second portion 112 of the gate structure is incorporated, the tab 112 provides isolation to and over the LOCOS isolation edge. A P+ guardring 116 including contact 117 surrounding and contacting the body 118 of the MOS device. This provides isolation as the P well 118 under portions of the thick field oxide 148 is inverted at the surface during and after irradiation. The tab 112 surrounds the drain region 131, source region 130, and surrounds and connects to gate 100. As is conventionally understood, the gate 100 over lies the device channel region 158 located between the source region 130 and drain region 131. The tab 112 provides for spacing the source 130 and drain 131 away from the thick oxide 148 while at the same time keeping this spacing region under gate threshold control, reducing the effect of a radiation-induced conduction path directly connected to and under the thick oxide 148.

As part of a method of manufacturing the device of FIGS. 5 and 6, a nitride mask may be used to define an opening 156 in the thick oxide layer 148 formed by a LOCOS process and covering the P well region 118. However, it should be understood that various other isolation techniques may be used as an alternative to LOCOS or in combination therewith, for example, shallow trench, deposited insulating layers, etc. Within the P well region 118, the opening 156 constitutes a boundary edge between the thick oxide layer region 148 (on the outside of the boundary edge 156) and the thin oxide layer region 101 (on the inside of the boundary edge 156).

As illustrated in FIG. 6, the tab 112 overlaps the thick oxide layer 148 and extends onto the thin oxide 101 on the active device region within the boundary edge 156. Thus, the outer boundary of the tab 112 is illustrated as edge 160, while the inner boundary is illustrated as edge 162. Thus, the tab 112 spans the shaded region illustrated in FIG. 5

When the tabbed structure 112 is implemented in combination with the P-type guardring 116, the resulting design also provides for the opportunity for reduced device width and length requirements. Thus, the design results in the opportunity to design using a relatively small footprint (including the P-type guardring) as well as simplified MOS modeling.

Returning to the innovation of the present disclosure with this radiation-induced parasitic conductance in mind, FIG. 6 shows the tabbed NMOS design combined with a P-type guardring 116 (including the P-type guardring contacts 117) that may be implemented with radiation hardened techniques and materials. The active device region 164 includes drain 131, source 130, gate 100, tab 112 and the P well region 118. The source and drain regions are shown with an N+ contact region on the N region portion as merely an example.

As shown in FIG. 6, and discussed above with reference to FIG. 5, the tab 112 extends from an outer edge 160 to an inner edge 162 and overlaps the opening 156 in the thick oxide layer 148 formed by a LOCOS process and covering the P well region 118. As will be explained in detail with reference to FIG. 6 herein, the opening 156 serves as the boundary edge between a thick oxide layer region 148 (on the outside of the boundary edge 156) and a thin oxide layer region 101 (on the inside of the boundary edge 156).

Figure 7:
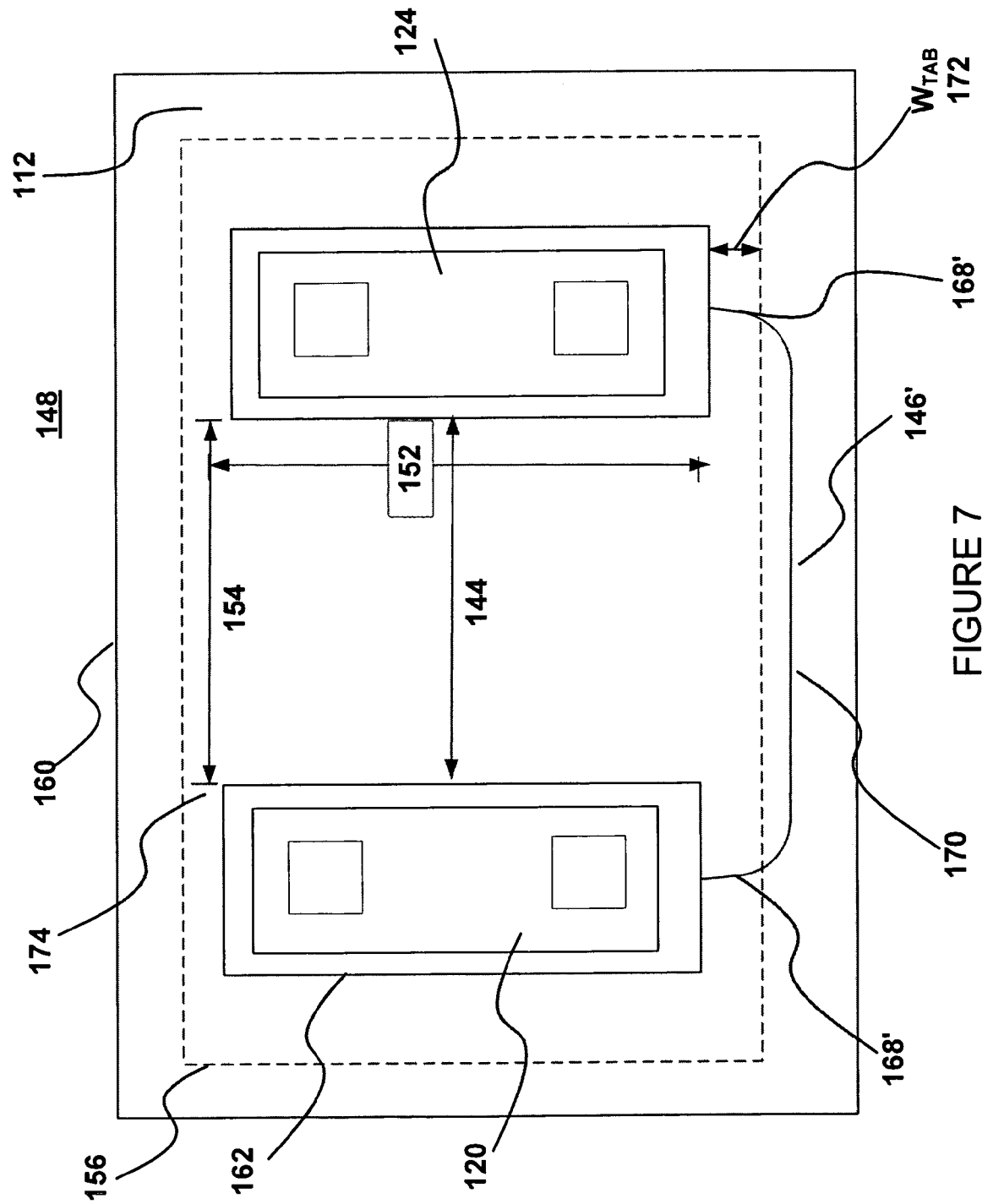
FIG. 7 is an explanatory diagram provided for the purposes of describing leakage reduction provided as a result of the device designed according to the present disclosure.

FIG. 7 is an explanatory diagram provided for the purposes of describing the drain-to-source leakage behavior resulting in the device designed according to the present disclosure. As in conventional devices, the current path 144 is controlled by the device threshold and not substantially affected by the total radiation dose; this is mainly because of the presence of thin gate oxide 174. However, by incorporating the tab structure 112 (shown in shading as the region between the outer edge 160 and the inner edge 162 and covering the opening edge 156), the P well region (not shown in FIG. 7) is less affected by radiation. Accordingly, the resistance along the current leakage path 146' may be maintained so as to make path 146' significantly less attractive then path 144 during device operation. Because path 146' travels under the polycrystalline tab 112, which is over thin oxide, there is no longer a leakage path from drain 120 to source 124 that is under the local thick oxide 148. It should be noted that in FIG. 7, the size of the source and drain regions 131 and 130 is larger or their distance from the opening edge 156 is shorter than that illustrated in FIG. 5 and gives a first level of radiation hardness. The structure and sizes in FIG. 5 yields a second and higher level of radiation hardness.

As explained in U.S. Provisional Pat. App. 61/088,501, as part of device design, it is advantageous to reduce channel size requirements for the width 152 and length 154 of the device channel 158. However, functionality of the produced device cannot be hindered based on significant size reductions. Therefore, it is recognized herein that some consideration of device size and device operation requirements should be part of device design process. U.S. Provisional Pat. App. 61/088,501 discloses that the incorporation of a polycrystalline silicon tab may be sufficient to address parasitic conduction between a drain and source of a particular device, (e.g., along path 146' as illustrated in FIG. 7).

Path 146' may include path components 168', 170, 168', between the drain region 131 and source region 130 through the P well region 118. However, as disclosed in U.S. Provisional Pat. App. 61/097,262, the incorporation of a polycrystalline silicon tab 112 having only a relatively short width $W_{TAB}$ 172 shown in FIG. 5 may still be insufficient to fully address the radiation-induced parasitic edge conduction effect between the drain and source.

Thus, although the tab structure 112 may be implemented using a fixed tab width that includes a distance $W_{TAB}$ 172, for example, 1 micron, there may remain issues of radiation-induced parasitic conduction when the NMOS channel length is approximately two times $W_{TAB}$ or more. Accordingly, the dimensions of the tab 112, in particular $W_{TAB}$ 172, should be determined based on the likelihood of radiation-induced parasitic conduction occurring between the drain 131 and source 130 regions through the P well region 118 in which they are formed. More specifically, the dimension $W_{TAB}$ 172 may be increased relative to the channel length 154 to further reduce the radiation-induced parasitic conduction between the drain and source. This may be particularly useful for design of long-channel NMOS devices.

In going forward with this explanation of the distance $W_{TAB}$ 172, it should be understood that the dimension $W_{TAB}$ 172 is not the total width of the tab 112 (bounded by edges 160, 162), but is a subset of that width and corresponds only to that portion of the tab 112 that between the device source 130 and drain 131 regions and the thick oxide layer 148 beginning at boundary 156 illustrated in FIG. 7.

As illustrated in FIG. 7, the radiation-induced parasitic conduction is experienced along the parasitic conduction path between the drain and source that includes path components 168', 170, 168'. When $W_{TAB}$ 172 is set too short (e.g., approximately half the NMOS channel length or less), the parasitic conduction path components 168, 170, 168 (as shown in FIG. 5) may be favored over the path along the length 154 of the channel 158 due to any reduction in resistance on path components 168, 170, 168 resulting from unintended effects of radiation. This radiation-induced parasitic conduction may be particularly pronounced for devices having relatively small channel widths 152. Thus, even with the incorporation of the tabbed structure 112, radiation-induced parasitic conduction may still occur between the source region 130 and the drain region 131 along path 146 through the P well region 118.

In FIG. 7, the embodiment variation increases the tab width $W_{TAB}$ 172 to effectively increase the resistance of the radiation-induced parasitic conduction path 146', thereby improving the radiation performance of the produced device. As shown in FIG. 7, the $W_{TAB}$ 172 dimension (indicated by the path component 168') is increased relative to the dimension $W_{TAB}$ (indicated by the path component 168 illustrated in FIG. 5). As a result, the dimension $W_{TAB}$ 172 is also increased relative to the length 154 of channel 158. By increasing the size of $W_{TAB}$ 172 relative to the channel length 154, the resistance of the path components 168', 168' is increased relative to the resistance along the channel length 154. This increase is the most effective way to increase parasitic resistance along path 146', which is comprised of path components 168', 170, 168'. This is because the remaining path component 170 is directly tied to the length 154 of the device channel 158. Thus, when the parasitic path component 170 is increased, so is the device channel length 154; accordingly, manipulating the length of the path component 170 is not effective to increase the radiation-induced parasitic conduction path resistance relative to the resistance along the device channel length 154.

Therefore, by increasing the dimension $W_{TAB}$ 172, the resistance along path components 168' is also increased. As a result, the current radiation-induced conduction path between the drain region 131 and source region 130 (i.e., 168', 170, 168' illustrated in FIG. 7) has a higher resistance.

However, as recognized by this disclosure, drain-to-source radiation-induced parasitic conduction is only one problem affecting radiation hardened devices. As explained above with reference to FIG. 1, device-to-device conduction still occurs when ionizing radiation results in trapped charge/ interface states that can invert the P well region under the local oxide (associated with leakage path 145 illustrated in FIG. 1). Thus, radiation-induced parasitic conduction may still be an issue even when drain-to-source radiation-induced parasitic conduction has been addressed.

Thus, in accordance with this disclosure, the tabbed structure 112 is combined with the P-type guardring to address device-to-device radiation-induced parasitic conduction as well. To simplify the explanation of the benefits of using a P-type guardring, the illustrative figure, FIG. 8, omits the tab structure; however, a cross section of the combination of the tabbed structure 112 and P-type guardring 116 is shown in FIG. 6.

Figure 8:
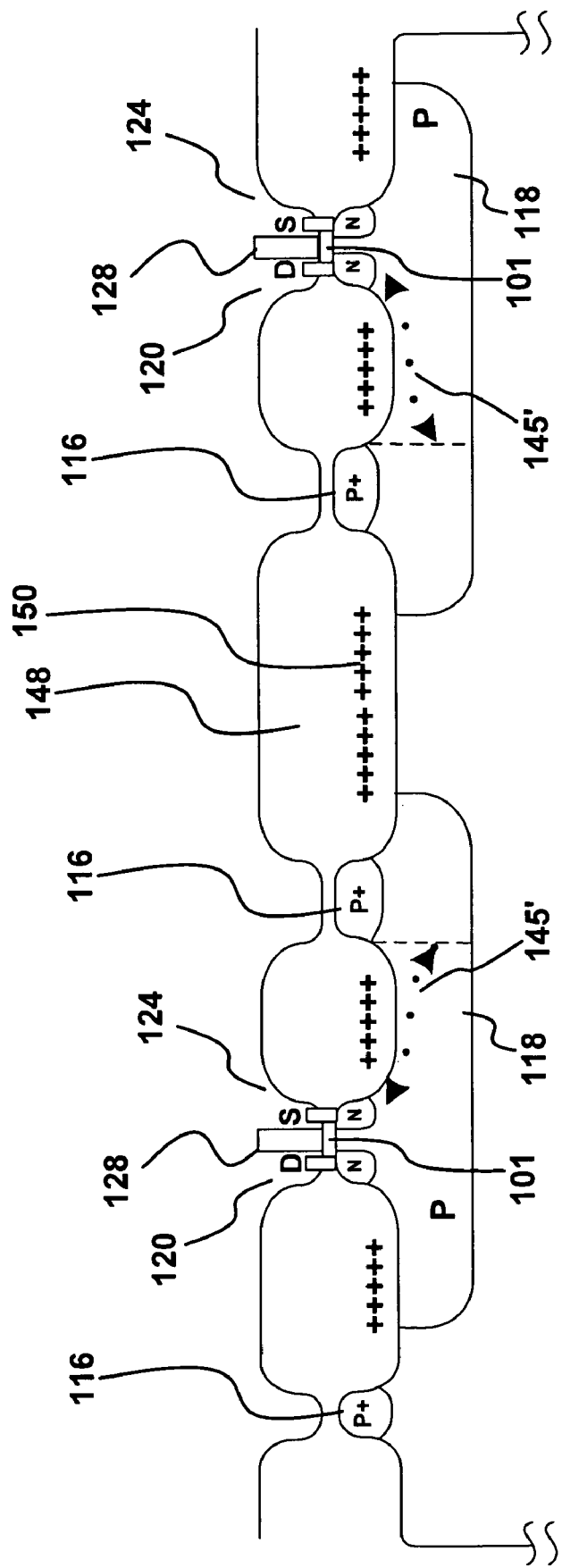
FIG. 8 is a second explanatory diagram provided for the purposes of describing leakage reduction provided as a result of the device designed according to the present disclosure.

As discussed in U.S. Provisional Pat. App. 61/097,262, and above with reference to FIG. 1, radiation-induced parasitic conduction may occur along the path between conventional devices such as along path 145 illustrated in FIG. 1. However, the incorporation of a P-type guardring 116, as illustrated in FIG. 8, can effectively reduce radiation-induced parasitic conduction between devices (including drain 120, source 124 and gate 128) by reducing the attractiveness of the conduction path 145'. By incorporating P-type guardring 116, the P+ in the P-type guardring 116 inverts at a much, much higher total radiation dose than the P well region 118. Accordingly, the P well 118 is less inverted as a result of the presence of the guardring 116 even if the thick oxide 148 includes oxide charges 150. Thus, incorporation of the P-type guardring 116 serves to reduce or eliminate the effects of inversion after radiation in the P well region 118 below the guardring. As a result, the path 145' is made less attractive because the resistance along path 145' is maintained, thereby interrupting or bisecting path 145'. Therefore, the device-to-device radiation-induced parasitic conduction path 145' is reduced or eliminated. Thus, with reference to FIGS. 5 and 6, an embodiment of the present disclosure includes the tabbed structure 112 combined with the P-type guardring 116, wherein the P guardring contacts 117 (shown in FIG. 5) surround and contact the body (P well 118) of the MOS device. Thus, the tabbed device with a P-type guardring protects the resulting device operation in a two-fold manner. First, the tab 112 reduces drain-to-source radiation-induced parasitic conduction as explained with reference to FIGS. 4, 6 and 7 above. Second, the P-type guardring 116 reduces device-to-device and device to substrate radiation-induced parasitic conduction, as explained with reference to FIGS. 1 and 8 above.

Figure 9:
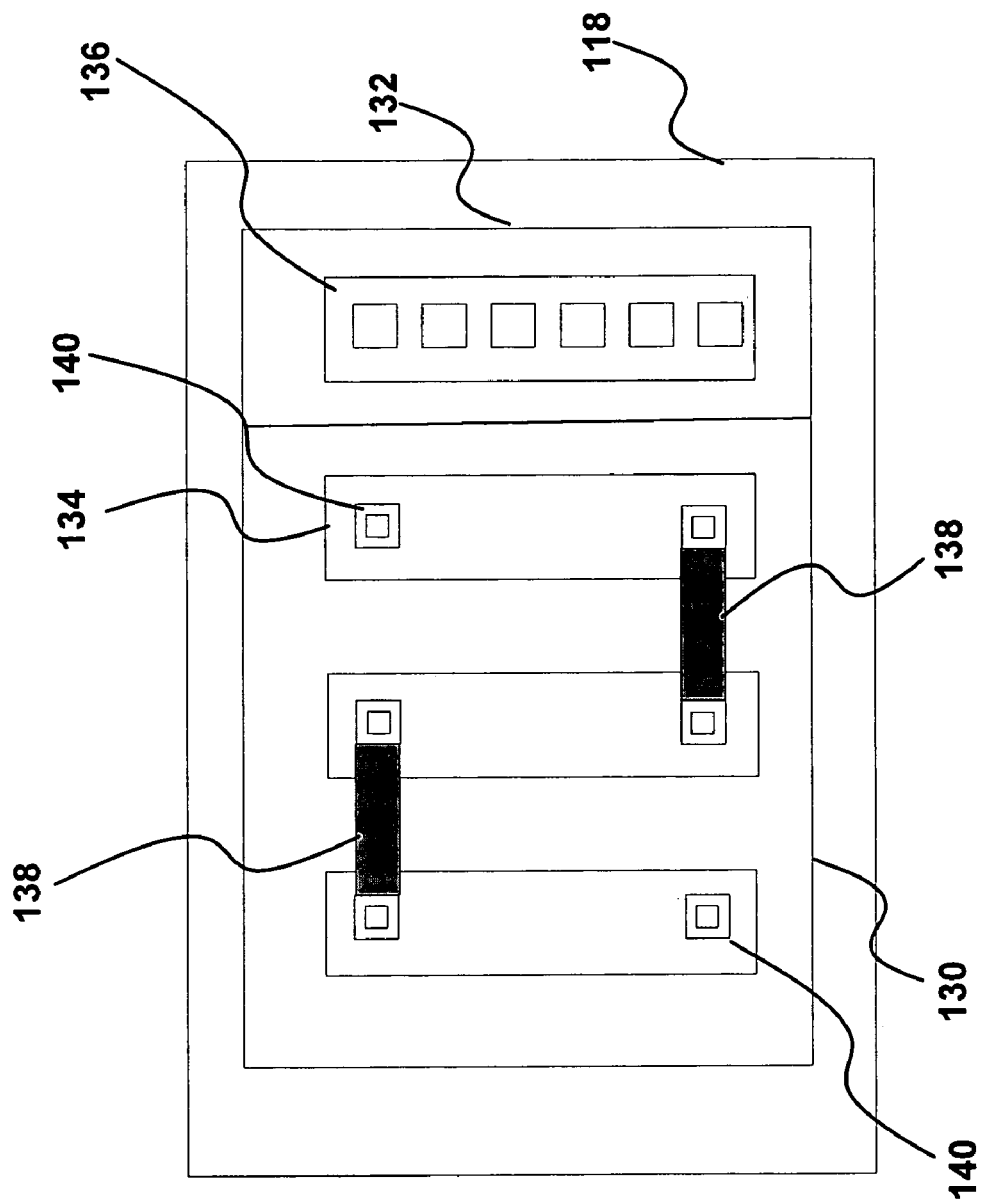
FIG. 9 illustrates a conventional structure used for radiation hardened N-type resistors.

As should be understood by one of ordinary skill in the art, the teachings of the present disclosure may be applied to the fabrication of a radiation hardened N-type resistor including bridged resistor segments. FIG. 9 illustrates a conventional structure used for radiation hardened N-type resistor segments 134. The resistor segments 134 are provided within an N-type implant region 130, which is provided in spaced relationship to a P-type implant region 132 including a P well contact region 136, all of which being included within the P well region 118. As shown in FIG. 9, the resistive element segments 134 are coupled together via contact bridges 138 and the terminals 140 provide the ultimate terminals for the formed radiation hardened resistive element. Such conventional devices are common; however, such conventional configurations suffer radiation-induced parasitic conduction issues in the same manner as explained above.

Therefore, implementing both the tabbed structure 112 and the P-type guardring 116 in combination with radiation hardened N-type resistor designs may have utility. This is because the combination of the P-type guardring and the tabbed design serves to reduce the field threshold conduction.

Figure 10:
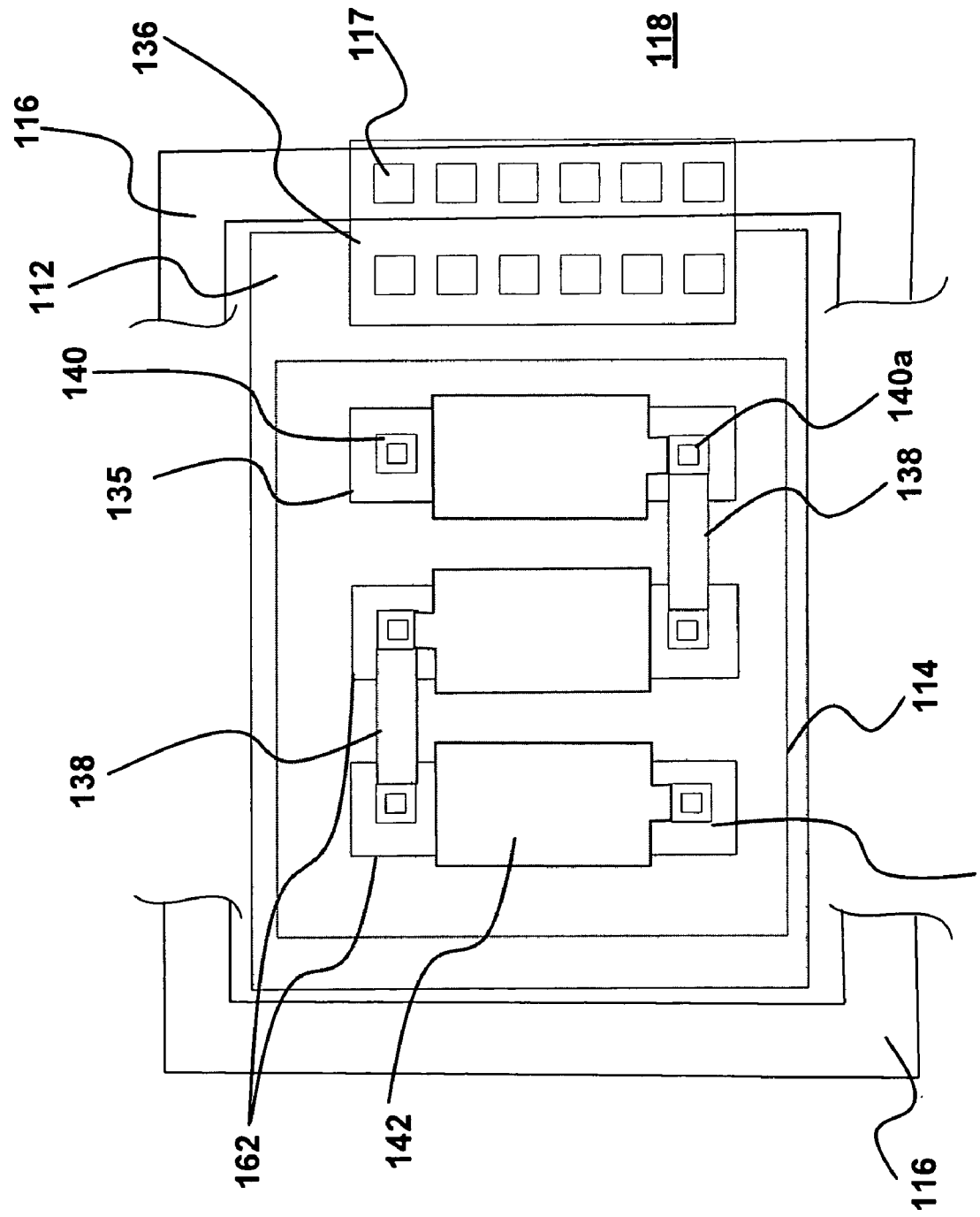
FIG. 10 illustrates a structure used for radiation hardened N-type resistors according to the present disclosure.

Accordingly, FIG. 10 illustrates a structure for radiation hardened N-type resistors according to the present disclosure. As shown in FIG. 10, the resistor segments 135 are coupled via contact bridges 138 and defined by the inner edge 162 of the polycrystalline silicon tab 112. The tab 112 is tied to the P well contact region 136 (implemented with P-type guardring contacts 117) within the P well region 118. Likewise, optional metal field shield 142 may be tied to the minus terminal 140a of the resistor segment terminals 140. As shown in FIG. 10, the resistor segments 135 are defined using the tab structure inner edge 162.

As above, the tabbed device with P-type guardring 116 protects the functionality of the N-type resistor segments 135 by reducing or preventing conduction paths resulting from the unintended effects of radiation hardening. It should also be understood that, where adjacent resistor segments 135 include terminals 140 that are not coupled together, the use of the polycrystalline silicon tab 112 serves to reduce device-to-device conduction there between.

Description of a variation of the above-described embodiments will now be provided as well as a more detailed description of a method of manufacturing illustrated embodiments.

The gate portion 100 lies on an insulative layer (thin oxide layer 101) in the active device region 164 and separates the source region 130 and drain region 131. In accordance with the teachings of U.S. Utility patent application Ser. No. 11/267,175, the tab 112 may serve as a pair of opposed second gate portions that extend from the thick oxide 148 over the transition 156 between thick and thin oxide regions onto the active device region 164. Thus, the gate portion 100 may be thought of as a first gate portion that extends between second gate portions (i.e., tab portions 112 on either side of the active device region 164). Thus, the source regions 130 and drain regions 131 have their lateral edges displaced from the edge of the device region 164, the thick oxide 148 and the transition boundary 156.

The device may be produced using a self-aligned gate technique, by using the gate portion 100 and the tab 112 or second gate portions in the self-alignment process. The first gate portion 100 defines the length of the channel region 154, while the portion of the tab 112 which may be thought of as opposed gate regions transverse to the gate portion 110 define the width of the channel 152, as defined by the width of the source and drain regions 130, 131.

The introduction of impurities to form the source and drain regions 130, 131 may use the gate portions (gate portion 100 and the portions of the tab 112 on either side of the active device region 164) as masks. The extension of the two tab portions 112 onto the active device region 164 is sufficient such that the impurity introduction and subsequent treatment reduces the diffusion of the impurities from the source and drain regions 130, 131 into a stressed area occurring at the boundary 156 produced by a LOCOS operation. Also, metal contacts to the source and drain regions 130, 131 and any resulting silicides may be displaced from the stressed area.

Although the tab structure 112 is shown as surrounding the source 130, the drain 131, beneficial results may also be obtained if the tab 112 only surrounded the drain 131.

The disclosed design resulting from the tabbed structure with appropriately selected dimensions and implemented in combination with a guardring provides a design structure with reduced device width and length requirements. Additionally, the design results in a relatively small footprint (guardring can be combined) as well as a simple MOS model. By specifically designing the width of the tab section $W_{TAB}$ based on the length of the channel.

Although increasing the $W_{TAB}$ dimension is one way of reducing radiation-induced parasitic conduction effects between drain regions and source regions. It should be appreciated that the radiation-induced parasitic conduction effect may also be affected by various other different dimensions of the device. Therefore, the dimension $W_{TAB}$ may be set based on the channel length 154 of the channel 158 alone, the channel length 154 and channel width 152 of the channel 158, or taking into consideration the channel length 154 and various other device dimensions, device materials or manufacturing techniques conventionally known to affect parasitic resistance.

Further, although not disclosed in extensive detail, it should be understood that the setting of the $W_{TAB}$ dimension and other dimensions of the polycrystalline silicon tab based on channel characteristics (e.g., channel length) and the theory behind that relationship are applicable to various other types of structures conventionally used to reduce radiation-induced parasitic conduction in semiconductor devices. Therefore, it should be appreciated that embodiments of this disclosure also include devices and structures using, for example, shallow trench technology or depositing of one or more insulating layers to provide isolation between devices and device components (e.g., source and drain).

It should also be appreciated that although the illustrated embodiments have utilized a gate material such as polycrystalline silicon, other gate materials may have utility including metals, e.g., aluminum.

It should be appreciated that the effect of incorporating both the tabbed structure and the guard ring discussed above has significant effects on the radiation dosage generated devices. For example, a prior art NMOS device without a P guardring may experience exposure of between 5K and 10 K Rad(Si). However, incorporation of a P guardring may increase the level at which the devices continue to operate to a level of approximately 50K Rad(Si). Further, the disclosed structure with a tabbed NMOS design and a P guardring may experience approximately 300K Rad(Si) total dose.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed:

1. An integrated circuit comprising:
   a substrate;
   an oxide layer extending into the substrate and having openings to the surfaces of active regions of the substrate;
   devices formed in the active regions of the substrate;
   one of the devices having a source region and a drain region spaced in one of the active regions and self-aligned with a corresponding gate, the gate including a first gate portion and a second gate portion;
   the first gate portion extending from the oxide layer over the substrate region between the source and drain regions and defining the length of a channel region of the device;
   the second gate portion being integral to the first gate portion, extending from the oxide layer over adjacent edges of the one active region and surrounding at least the drain region with the first gate portion; and
   a guardring region formed in an active region, the guardring having a first electrical conductivity type and surrounding the source region, the drain region and the gate, the one active region having the first electrical conductivity type, the sources region and the drain region having a second electrical conductivity type.

2. The integrated circuit of claim 1, wherein the guardring isolates the one device formed in the active region from devices in other active regions.

3. The integrated circuit of claim 1, wherein the guardring surrounds the substrate having the second electrical conductivity type.

4. The integrated circuit of claim 1, wherein at least one second gate portion dimension is set based on at least the length of the channel region.

5. The integrated circuit of claim 1, wherein a parasitic conduction path between the drain and source regions has a higher resistance than a channel resistance of the at least one device.

6. The integrated circuit of claim 1, wherein a distance between the drain and oxide layer is greater than half the device channel length.

7. The integrated circuit of claim 1, wherein the oxide layer extending into the substrate is formed via local oxidation of a top surface of the substrate.

8. The integrated circuit of claim 1, wherein the guardring is laterally separated from the opening of the one active region by the oxide layer.

9. The integrated circuit of claim 1, wherein each of the first and second gate portions includes a conductor separated from the substrate by an oxide layer.

10. The integrated circuit of claim 1, wherein the first conductivity type is P-type and the second conductivity type is N-type.

11. An integrated circuit comprising:
    a substrate;
    an oxide layer extending into the substrate and having openings to the surface regions of the substrate; and devices formed in the openings to surface regions, wherein one of the devices having a source region and drain region spaced in one of the openings to the surface regions and self-aligned with a corresponding gate, the gate including a first portion extending over the opening to the surface region between the source and drain regions and defining the length of a channel region of the device and a second portion extending from the oxide layer over an adjacent edge of the opening to the surface region and defining the width of the channel region, and wherein a distance between the drain and oxide layer is greater than half the device channel length.

12. The integrated circuit of claim 11, wherein a parasitic conduction path between the drain and source regions has a higher resistance than a channel resistance of the at least one device.

* * * * *